United States Patent
Di Fonzo et al.

(10) Patent No.: US 9,934,877 B2
(45) Date of Patent: Apr. 3, 2018

(54) NANOCRYSTALLINE/AMORPHOUS COMPOSITE COATING FOR PROTECTING METAL COMPONENTS IN NUCLEAR PLANTS COOLED WITH LIQUID METAL OR MOLTEN SALT

(71) Applicant: FONDAZIONE ISTITUTO ITALIANO DI TECNOLOGIA, Genoa (IT)

(72) Inventors: Fabio Di Fonzo, Milan (IT); Marco Beghi, Varese (IT); Francisco Garcia Ferre, Olbia-Tempio (IT)

(73) Assignee: FONDAZIONE ISTITUTO ITALIANO DI TECNOLOGIA, Genoa (IT)

( * ) Notice: Subject to any disclaimer, the term of this patent is extended or adjusted under 35 U.S.C. 154(b) by 334 days.

(21) Appl. No.: 13/779,066

(22) Filed: Feb. 27, 2013

(65) Prior Publication Data

US 2014/0241485 A1    Aug. 28, 2014

(51) Int. Cl.
| | |
|---|---|
| *G21C 3/07* | (2006.01) |
| *G21C 21/00* | (2006.01) |
| *C23C 14/02* | (2006.01) |
| *C23C 14/08* | (2006.01) |
| *C23C 14/28* | (2006.01) |

(52) U.S. Cl.
CPC .............. *G21C 3/07* (2013.01); *C23C 14/025* (2013.01); *C23C 14/027* (2013.01); *C23C 14/081* (2013.01); *C23C 14/28* (2013.01); *G21C 21/00* (2013.01); *Y02E 30/40* (2013.01)

(58) Field of Classification Search
CPC ... C23C 14/025; C23C 14/027; C23C 14/081; C23C 14/28; G21C 21/00; G21C 3/07; G21C 17/0225; G21C 3/06; G21C 3/20
USPC ................ 376/410, 412, 416, 417, 457, 305
See application file for complete search history.

(56) References Cited

U.S. PATENT DOCUMENTS

| | | | | |
|---|---|---|---|---|
| 3,900,592 A * | 8/1975 | Kennedy | ............. | C23C 14/0021 427/249.19 |
| 4,002,782 A * | 1/1977 | Warner | ................... | C23C 24/00 427/205 |
| 4,846,899 A * | 7/1989 | Wilson | .................... | C22C 38/50 148/232 |
| 4,904,542 A * | 2/1990 | Mroczkowski | ..... | C23C 14/0652 416/241 B |
| 5,026,517 A * | 6/1991 | Menken | .................... | G21C 3/07 376/305 |
| 5,384,200 A * | 1/1995 | Giles et al. | .................... | 428/552 |
| 5,711,826 A * | 1/1998 | Nordstrom | ........... | B22D 23/003 148/519 |
| 6,500,279 B2 * | 12/2002 | Chen | ............................. | 148/325 |
| 8,202,629 B2 * | 6/2012 | Heinzel et al. | ............... | 428/684 |
| 2009/0035604 A1 | 2/2009 | Heinzel et al. | | |

FOREIGN PATENT DOCUMENTS

| | | |
|---|---|---|
| EP | 1 896 627 B1 | 10/2009 |
| WO | WO 2007/000261 A2 | 1/2007 |

OTHER PUBLICATIONS

S.C. Tjong and H. Chen "Nanocrystalline materials and coatings" Materials Science and Engineering R 45 (2004), pp. 1-88.*

Di Fonzo, F. et al. "Growth regimes in pulsed laser depositioin of aluminum oxide films", Applied Physics A, vo. 93, 2008, pp. 765-769.

Oliver, W. et al. "An improved technique for determining hardness and elastic modulus using load and displacement sensing identation experiments", J. Mater. Res., vol. 7, No. 6, Jun. 1992, pp. 1564-1683.

Bhushan, B. et al. "Nanomechanical characterization of solid surfaces and thin films", International Materials Reviews, vol. 48, No. 3, 2003, pp. 125-164.

Kundu, T., editor, "Ultrasonic Nondestructive Evaluation", CRC Press, Boca Raton, FL, 2004, 82 pgs.

Beghi, M. et al. "Precision and accuracy in film stiffness measurement by Brillouin spectroscopy", Review of Scientific Instruments, vol. 82, 2011, pp. 053107-1-053107-11.

* cited by examiner

*Primary Examiner* — Sharon M Davis
(74) *Attorney, Agent, or Firm* — Merchant & Gould P.C.

(57) ABSTRACT

A nuclear fuel cladding tube for a liquid-metal or molten-salt cooled reactor includes a tubular body of metal material and a protective coating applied on an outer surface of the tubular body, to contact the coolant. The coating includes at least one layer of coating material selected from the group consisting of ceramic materials, refractory metals, and FeCrAlY alloys, and includes a matrix composed of the coating material in amorphous phase, inside which nanodomains composed of the coating material in crystalline phase are dispersed.

9 Claims, No Drawings

NANOCRYSTALLINE/AMORPHOUS COMPOSITE COATING FOR PROTECTING METAL COMPONENTS IN NUCLEAR PLANTS COOLED WITH LIQUID METAL OR MOLTEN SALT

The present invention generally relates to the protection of metal components against corrosion in advanced nuclear systems employing, as a coolant, liquid metals (LM) such as lithium and sodium, heavy liquid metals (HLMs) such as lead, lead-bismuth eutectic (LBE) and lead-lithium eutectic (LLE), or molten salts (MS) such as lithium, beryllium, sodium, and potassium fluorides.

BACKGROUND OF THE INVENTION

Liquid metal corrosion (LMC) has been identified as one of the main problems in relation to molten-metal cooled nuclear systems, such as lead fast reactors (LFRs), accelerator driven systems (ADSs) or fusion reactors. Such corrosion is a physical or physicalchemical process involving, inter alia, the dissolution of steel constituents and their transport in the liquid and solid phases. LMC may alter the microstructure, composition, and morphology of steel components, with an adverse effect on the mechanical performance thereof.

One of the main approaches to mitigate the corrosion effects is to promote the in situ formation of iron and chromium oxide protective layers on the surface of the steels, typically austenitic or ferritic/martensitic steels. Such a solution can be achieved by injecting oxygen into the coolant and by an accurate control of the concentration thereof in the liquid metal. However, such a method is not reliable for temperatures exceeding 500° C.

In the last decades, research focused on high temperature corrosion mechanisms and methods for structural material protection in fourth-generation plants. All over the world, experimental studies have been carried out in these fields, mainly targeting oxygen control techniques and the development of alumina coatings, aluminization surface treatments, or even new materials, such as oxide dispersion-strengthened steels (ODSs).

In spite of such efforts, the protection of structural steels against HLM corrosion still remains an unresolved issue.

In this regard, the use of ceramic coatings could be a valid option. However, while an efficient use thereof as an environmental barrier would require chemical stability, compactness, stiffness, high wear resistance, excellent adhesion and a strict correspondence with the mechanical properties of the steels, meeting all these requirements by the conventional industrial techniques is difficult, especially at low operating temperatures.

In particular, the present invention relates to a nuclear fuel cladding tube for a liquid-metal or molten-salt cooled reactor, said cladding tube comprising a tubular body in metal material and a protective coating applied on an outer surface of the tubular body, intended, in use, to contact the coolant.

It is known that the nuclear fuel cladding is one of the components intended to be subjected to the most severe conditions, since it is provided to operate, in the advanced nuclear systems, at temperatures that could reach 800° C.

In such regard, from WO 2007/000261 a technique is known, providing for the development of thin protective alumina coatings by an aluminization surface treatment and the subsequent selective oxidation of steel, dictating a suitable oxygen concentration in the liquid metal. However, Al diffusion in steel, an insufficient Al content in the surface alloy, due to electronic pulse overlap during the GESA treatment (which evaporate a considerable amount of that metal), and the "fretting corrosion" phenomenon, which occurs at the contact point between the fuel rods and the spacer grids, following the repeated contact between rod and grid (which disrupts the very thin alumina layer by its mechanics, which is not known or at least not fully identified), can lead to a failure of the surface protective layer, thus to the steel exposure to the liquid metal, resulting in corrosion.

Therefore, an object of the invention is to propose a protection for the nuclear fuel cladding that allows overcoming the above-mentioned drawbacks.

SUMMARY OF THE INVENTION

In view of such an object, it is the object of the invention a cladding tube of the type initially defined, in which said coating includes at least one layer of coating material selected from the group consisting of ceramic materials, refractory metals, and FeCrAlY alloys, and comprising a matrix composed of the coating material in the amorphous phase, inside which nanodomains composed of the coating material in crystalline phase are dispersed.

Another object of the invention is a method for producing a nuclear fuel cladding tube for a liquid-metal or molten-salt cooled reactor, said method comprising:
providing a tubular body of metal material, and
applying a protective coating on an outer surface of the tubular body, intended, in use, to contact the coolant,
in which said method is characterized in that the protective coating is applied by physical vapor deposition, so as to include at least one layer of coating material selected from the group consisting of ceramic materials, refractory metals, and FeCrAlY alloys, and comprising a matrix composed of the coating material in amorphous phase, inside which nanodomains composed of the coating material in crystalline phase are dispersed.

DETAILED DESCRIPTION OF THE INVENTION

Preliminary experiments showed that the use of physical vapor deposition, in particular, pulsed laser deposition (PLD), for growing protective coatings has the advantage to produce dense, compact layers with a smooth surface and a strong interface bond. Furthermore, the coatings have a strict correspondence with the thermal-mechanical properties of the metal materials used.

Furthermore, some corrosion resistance tests carried out on metal samples provided with a protective layer according to the invention gave excellent results, thus indicating that the present invention can solve the problems set forth above in relation to the prior art.

According to an embodiment of the present invention, an $Al_2O_3$ coating grown by PLD is applied on a cladding tube outer surface. Such a surface coating acts as an environmental barrier, in order to prevent corrosion phenomena to the metal material composing the tubular body, at temperatures that could reach 800° C. The tubular body material is selected, in particular, from the group consisting of ferritic-martensitic steels, austenitic steels, oxide dispersion strengthened steels.

The protective coating nanostructure consists in a dispersion of nanocrystalline domains in an amorphous matrix.

Such a type of nanostructure confers mechanical properties similar to those of the metal material to the protective coating.

As disclosed above, the protective coating application takes place by means of PLD. As it is known, it is a thin film deposition technique (in particular, a physical vapor deposition technique) in which a high-power laser pulse is focused within a vacuum chamber to hit a target of the material to be deposited. Such a material is vaporized, forming a plasma plume starting from which the material deposits, forming a thin film on a substrate facing the target.

Within the scope of the present invention, the laser wavelength is preferably 248 nm, and the laser incidence angle is 45° with respect to a perpendicular to the substrate surface. The laser pulse duration ranges between 10 and 20 ns, and the target-substrate distance ranges between 10 and 80 cm. It shall be apparent that other types of lasers, for example, solid-state Nd:YAG lasers, are capable of obtaining the same effects. The laser fluence ranges between 0.5 and 20 $J/cm^2$. In addition, a background gas is present in the vacuum chamber, in particular, oxygen, the pressure of which ranges between 0.1 and 5 Pa.

Although PLD is preferred from a productive point of view, the invention encompasses other physical vapor deposition (PVD) techniques, for example, sputtering, which allow obtaining ceramic coatings having an amorphous-nanocrystalline composite structure similar to that of the present invention. A feature common to such techniques is to provide that the substrate (tubular body) on which the ceramic material is deposited is kept at a relatively low temperature (experimentally, positive results at room temperature, as well as at 400 and 600° C., have been obtained with the PLD technique); unlike, for example, the chemical vapor deposition (CVD), which requires that the substrate has a high temperature, such as to cause the decomposition of the gas precursors and/or the reaction thereof with the material of which the substrate is composed. A high temperature of the substrate during the coating process is undesired, since, beside making the productive process more complex, it may alter the microstructure of the tubular body metal material, and worsen the material mechanical properties. For example, the coating adhesion to the substrate is weaker in the case of CVD, compared to PLD.

Besides alumina, another ceramic material can be used as a material for the protective coating, which is selected from the group consisting of aluminum, zirconium, silicon, tungsten, tantalum, titanium, chromium, and molybdenum oxides, carbides, and nitrides, or a combination thereof, or a refractory metal, such as, for example, molybdenum or tantalum, or a FeCrAlY alloy, such as, for example, an alloy containing 5.0% Al, 0.02% C, 22.0% Cr, 0.2% Mn, 0.3% Si, 0.1% Y, 0.1% Zr, and the rest Fe, or an alloy containing 9% Al, 14.0% Cr, less than 0.5% Y, and the rest Fe [% wt]. In fact, it can be expected that, with the PLD deposition method, it is possible to obtain coatings with mechanical and anti-corrosion properties similar to those of alumina.

According to a preferred embodiment of the invention, the protective coating has a functionally graded structure. By means of a functionally graded barrier (FGB), it is possible to obtain an extremely even transition from the thermal-mechanical properties of the component material to those of the barrier material. The ceramic and metal layers are periodically alternated, with neat interfaces between each layer and a period for example, between 1 and 100 nm. The composition along the FGB thickness is adjusted so as to vary in an even manner from a pure metal material at the substrate-FGB interface, to a pure ceramic material at the FGB surface. In order to obtain a FGB, it is possible to coat the metal with a selected number of layers of different materials, all of them having the same thickness. They could be two different materials, but also more, in principle. Another possibility is to make so that the layers have a variable thickness. In this manner, it can be made so that the layers are mainly in metal near the interface with the cylindrical body (metal layers with a larger thickness compared to the ceramic layers), and mainly in ceramic near the FGB surface (ceramic layers with a larger thickness compared to the metal layers). In this manner, an almost continuous transition of the composition would be obtained, from a metal one (at the cylindrical body-FGB interface) to a ceramic one (on the FGB surface). Finally, it is also possible to have real metal-ceramic composite layers in which the materials are mixed or, better, a continuous composition transition from a pure metal one to a pure ceramic one, by a magnetron sputtering co-deposition.

As disclosed before, some experiments on PLD application of $Al_2O_3$ on substrates have been carried out to assess the mechanical and environmental barrier properties of the thus-obtained coatings. Such experiments will be detailed herein below.

Experiment 1

1. Preparation of the Materials

Alumina coatings have been grown on titanium alloy, stainless steel substrates. Such substrates were prepared by cutting commercially pure 10×25×1 $mm^3$ stainless steel and Ti6Al4V alloy plates, which were subsequently polished by sequentially using SiC-based abrasive papers with increasingly finer grain, chamfered, cleaned with an ultrasonic device in acetone and isopropanol, and rinsed in isopropanol. Before the deposition, the substrates have been subjected again to an in situ cleaning treatment by a pre-sputtering operation with ionic bombardment. The $Al_2O_3$ layers reproduce the residual roughness of the substrates.

The $Al_2O_3$ layers were synthetized by PLD in a stainless steel vacuum chamber with low oxygen pressure. Process parameters have been selected to obtain dense, compact layers with smooth surfaces. A pure (99.99%) polycrystalline alumina target was mounted on a motorized support and subjected to a pulsed UV beam (248 nm), oriented at 40° with respect to a perpendicular to the substrate and generated by a Lumonics KrF laser with a pulse frequency of 20 Hz. The deposition process was optimized to improve the film morphology by reducing splashing. Thus, the pulse energy was set at 250 mJ, while the focus was adjusted so as to have a fluence of 2.38 $J/cm^2$. The target-substrate distance and the oxygen background pressure were set at 50 mm and 0.1 Pa, respectively. Further details of the experimental set-up can be found in the publication Di Fonzo et al., "*Growth regimes in Pulsed Laser Deposition of aluminum oxide films*" Appl. Phys. A 2008; 93: 765-9, incorporated herein as a reference.

2. Characterization of Materials

Characterization of the $Al_2O_3$ layers was carried out on the stainless steel substrates due to a higher availability of such a type of samples. However, it is worth noting that the coating properties depend only on the deposition process. Therefore, herein below the characterization of the materials will be referred to the case of steel substrates. In any case, since, as it will be understood herein below, some characterization methods involve surface layers, particular attention has been devoted to avoid any possible influence of the substrates on the measurement results.

2.1 Surface Morphology, Composition, and Structure

The surface morphology and the broken-out sections of the samples were studied by a field-emission (FE) SEM microscope (Zeiss Supra 40), provided with an EDX spectrometer (Oxford Instruments INCA). The potential difference of electrons was set at 2 kV for imaging and at 10 kV for elemental analysis. The crystalline structure of the films was studied with an X-ray diffractometer (Pananalytical X-pert Pro, provided with a Xcelerator detector) in the theta-theta configuration. A Pananalytical PW3020 X-ray diffractometer was used for reduced angle XRD in a parallel beam geometry, with an incidence angle $\Omega=0.5°$, an angular range of 10°-100° and an angular pitch of 0.2°. The nanostructure of the coatings was analyzed by high resolution TEM by using a FEI Tecnai F20ST instrument at a potential difference of 200 kV in bright field mode.

2.2 Mechanical Properties and Wear Resistance

Nanoindentation measurements were carried out with a nanoindenter (Micromaterial Nanotest System, Wrexham, UK) with a pendulum system and a Berkovich diamond tip. Controlled load indentations have been applied in multiple sets of square matrices of 9 indentations, with a maximum load ranging between 10 and 50 mN. In all the tests, the maximum load was kept constant for 5 seconds, thus allowing the development of the viscous deformation; in order to measure the thermal runaway, a maintenance of 60 seconds at 20% of the discharge curve was established. The collected data have been then corrected for machine compliance and thermal runaway by assuming a constant rate throughout the test. The mechanical properties, i.e., the reduced Young's modulus and hardness, were determined by the indentation curves following the approach of Oliver and Pharr [Oliver W C, Pharr G M, J Mater Res 1992; 7-6: 1564-83, 39; Bushan B, Li X, Int Mat Rev 2003; 48-3: 125-64].

Nanoscratch tests were carried out with a conical diamond probe with a nominal tip radius of 10 µm. A 500-µm scratch length was used; the load was kept constant at 0 mN following a contact for the first 100 µm, then it was increased to 500 mN with a constant increase of 2.5 mN/s, at a scanning rate of 2 µm/s, corresponding to a load/distance ratio of 1.25 mN/µm. All the parameters were selected based on preliminary experiments (data not shown). The scratch resistance test procedure provided for four sequential scanning operations on each sample.

Brillouin spectroscopy (BS) measurements were carried out by using an Ar+ laser (Innova 300, Coherent Inc.), operating at 200 mW and at a wavelength of 514.5 nm; a backscattering geometry was adopted, with incidence angles of 30°, 40°, 50°, 60°, and 70°. More details about the experimental set-up can be found in Beghi M G, Every A G, Zinin P V, in "Ultrasonic nondestructive evaluation", published by T. Kundu (CRC Press, Boca Raton, Fla., 2004). Light scattering was analyzed with a tandem multipass Fabry-Perot interferometer of the Sandercock type. By following the procedure disclosed in Beghi M G, Di Fonzo F, Pietralunga S, Ubaldi C, Bottani C E. "Precision and accuracy in film stiffness measurement by Brillouin spectroscopy" Rev Sci Instr, 2011; 82: 053107, the refraction index of the coatings was measured with a WVASE32 ellipsometer (Woollam Co. Inc.), operating in the 300-1700 nm wavelength range.

3. Results

3.1 Surface Morphology, Composition, and Structure

The surface of the coatings is almost perfectly smooth, with the exception of a few defects of sub-micrometer dimensions (droplets). In spite of the absence of filtration systems, the deposition process involved only a low surface covering by the droplets, by virtue of the laser fluence optimization.

Cross-sectional views of the broken-out samples showed that the coatings are dense and compact across the entire thickness. Furthermore, the microstructure is uniform, free from columnar growth or open structures. The coating thickness was in the range of 0.5 µm-8 µm, according to the number of laser pulses, and it was obtained with a deposition rate of about 1 nm/s. Such a rate is comparable with that of a closed field unbalanced magnetron sputtering (CFUMS), and it is higher than the typical deposition rates with magnetron sputtering. Furthermore, the experimental PLD equipment can be easily modified to considerably to increase such parameter by using higher repetition rates with commercially available lasers.

The microstructure observed cannot be obtained at room temperature by the conventional deposition techniques. This can be explained with the relatively low kinetic energy of the chemical species of the coating, which is usually too low to promote the diffusion and rearrangement on the substrate surface. In PLD, the high kinetic energy of the ablated species is transferred to the growing film, thus creating microstructures that are compact and free from defects with a strong interface adhesion, even at low temperatures.

XRD analysis did not show the presence of peaks attributable to $Al_2O_3$ crystalline phases, thus indicating a mainly amorphous or unordered nanocrystalline structure, as it could be expected for thin alumina films grown at low temperature.

Only low angle XRD spectra showed a small peak that could be attributed to $\alpha$-$Al_2O_3$ ($2\theta \approx 35.1°$).

The cross-sectional high resolution TEM clearly showed that the coatings are composed of an homogeneous dispersion of $Al_2O_3$ nanocrystalline particles in an amorphous matrix. The indexing of fringes due to lattice and diffraction patterns of selected areas confirmed the formation of an $Al_2O_3$ nanocrystalline phase.

Finally, as in the previous EDX measurements (Beghi M G, Di Fonzo F, Pietralunga S, Ubaldi C, Bottani C E. "Precision and accuracy in film stiffness measurement by Brillouin spectroscopy" Rev Sci Instr, 2011; 82: 053107) and according to the deposition conditions described herein, the samples resulted understoichiometric in the oxygen content, due to a partial loss of the most volatile components (in this case, oxygen) of the target material during the ablation process. A low pressure of background oxygen pressure (0.1 Pa) partially compensates for such an effect, but it is not sufficient to obtain perfectly stoichiometric $Al_2O_3$ coatings. Higher oxygen pressures could produce stoichiometric alumina, but this would also slow the ablated species, causing porous films to grow.

3.2 Mechanical Properties

The structural characterization of the coatings showed that these consist in a dispersion of $\alpha$-$Al_2O_3$ nanodomains in an amorphous matrix. Therefore, in the absence of an oriented crystalline structure or a mesostructure (e.g., a columnar structure), the $Al_2O_3$ barrier layers were considered herein as mechanically isotropic. According to this scheme, the components $C_{ij}$ of the elastic tensor are fully determined only by two independent variables. Therefore, the coating stiffness can be represented by a point in a bidimensional "space of stiffness", the coordinates of which can be taken from any pair of magnitudes selected from Young's modulus E, creep stiffness G, Poisson coefficient v, bulk modulus B, $C_{11}$ and $C_{44}$.

3.3 Nanoindentation

Indentations were obtained on layers having a thickness of 8 μm on steel substrates. A preliminary set of indentations was obtained with different maximum loads, to determine the dependence of the results on penetration depths. In fact, in nanoindentation experiments on thin films, the results tend to be influenced by a certain dispersion and to overestimate stiffness when the penetration depth is reduced, probably due to surface stiffness and to tip roundness effects. On the other end, if the penetration depth is large, the results can be affected by the substrate properties. Therefore, the preliminary measurements were aimed to determine a penetration range in which the results were not dependent on the penetration depth. For steel substrates, a range around a maximum load of 50 mN was identified, corresponding to a penetration depth of 500 nm, which is still well below a tenth of the coating thickness. The results are shown in the following Table 1.

TABLE 1

| Substrate | Max. load [mN] | Max. pen. Depth [nm] | Elastic work [nJ] | Plastic work [nJ] | $E_r$ [GPa] | H [GPa] |
|---|---|---|---|---|---|---|
| Steel | 50 | 477 ± 20 | 3.352 ± 0.238 | 5.331 ± 0.620 | 208 ± 6 | 10 ± 1 |

The standard approach when using the measured value of the reduced Young's modulus $E_r$ is to introduce a hypothesis for the Poisson coefficient $v$ to obtain a value for the Young's modulus $E$ of the material by the equation 1:

$$\frac{1}{E_r} = \frac{1-v^2}{E} \quad (1)$$

However, the mechanical properties strongly depend on the material microstructure, which, in turn, depends-in the case of thin films-on the deposition method and the relative process conditions. In the present case, due to the peculiar characteristics of the $Al_2O_3$ barrier synthetized by PLD, any hypothesis about $v$ would be not well founded. Therefore, to avoid arbitrary hypotheses, further information was sought by a combination of nanoindentation with Brillouin spectroscopy (BS) and ellipsometry, as discussed herein below.

In spite of the understoichiometric composition of the barrier layers, the measured hardness was still moderately high, with about 10 GPa. Such a result well corresponds to the values set forth in the literature for coatings grown by PLD. Furthermore, it is significantly larger than for amorphous coatings obtained by chemical vapor deposition (CVD). Sputtering-based techniques provide similar results, but the deposition rate is significantly lower.

3.4 Brillouin Spectroscopy

Brillouin spectroscopy allows measuring the propagation rate of the acoustic modes for sub-micrometer wavelengths. A homogeneous isotropic continuum supports longitudinal and transversal bulk waves, the speeds of which are, respectively, $$v_l = \sqrt{C_{11}/\rho}, v_t = \sqrt{C_{44}/\rho} \quad (2)$$

where $\rho$ is the density, and, at a free surface, the Rayleigh wave with speed $v_R$. If all these modes are detected, and if the density is independently measured, it is possible to obtain a complete elastic characterization, for materials in bulk and thin films. Recently, an entirely optical characterization procedure was proposed, combining ellipsometry and BS; it was also carried out a detailed determination of the precision and accuracy than can be obtained (Beghi M G, Di Fonzo F, Pietralunga S, Ubaldi C, Bottani C E. Precision and accuracy in film stiffness measurement by Brillouin spectroscopy. Rev Sci Instr, 2011; 82: 053107).

The same characterization procedure was followed for $Al_2O_3$ barrier layers grown by PLD. By the BS spectrum, only two doublets could be identified with certainty. The first peak (~55 GHz) is due to the scattering of longitudinal bulk waves, and it is independent from the incidence angle; the second peak (~14 GHz) is due to the scattering of Rayleigh waves. The present analysis is based only on these two doublets. The results are summarized in Table 2.

TABLE 2

| Substrate | $f_l$ [GHz] | $v_l$ [m/s] | $v_R$ [m/s] |
|---|---|---|---|
| Steel | 55.41 ± 0.23 | 8655 ± 36 | 4328 ± 42 |

The analysis of BS results required independent measurements of the refraction index $n_a$ and the density $\rho_a$ of the alumina barrier layers. The refraction index was measured by ellipsometry, by using a semi-infinite model and a $1/\lambda$ expansion. At the $Ar^+$ ion laser wavelength (514.5 nm), $n_a=1.647\pm0.003$. Such a value was then used to obtain the speed of the acoustic modes from the spectral frequencies measured.

On the other end, the density $\rho_a$ could not be measured directly, nor could it be estimated by the crystalline structure, since the barrier layers are mainly amorphous. Therefore, the density $\rho_a$ was calculated by the Lorentz-Lorenz formula. Such a formula correlates the density with the refraction index for a given molecular polarization. A reference state for $Al_2O_3$ is given by sapphire, in its crystalline phase a. The available average refraction index $n_s$ of sapphire ranges between 1.770 and 1.773, while its density $\rho_s$ ranges between 3970 and 3980 kg/m³. Density $\rho_a$ was estimated from these values.

The measured primary values $n_a$, $\rho_s$, and $n_s$ and the uncertainties thereof are unrelated: therefore, the usual error propagation formula applies. The triple median ($n_a=1.647\pm0.003$, $\rho_s=3975\pm10$ kg/m³; $n_s=1.7715\pm0.002$) gives $\rho_a=3471\pm17$ kg/m³. Inaccuracies on these amounts do not give statistical uncertainties, but systematic. The latter ones can be accounted for by considering, in a more deterministic approach, the extremes of the range presumably spanned by $\rho_a$. Such extremes are found for the triples ($n_a=1.644$, $\rho_s=3965$ kg/m³; $n_s=1.7735$) and ($n_a=1.650$, $\rho_s=3985$ kg/m³; $n_s=1.7695$), yielding $\rho_a=3443$ kg/m³ and $\rho_a=3500$ kg/m³, respectively.

3.5 Determination of the Mechanical Properties: Combination of Nanoindentation, Brillouin Spectroscopy, and Ellipsometry In order to obtain an accurate and precise estimation of the elastic properties of $Al_2O_3$ barrier layers, the results of indentation and BS measurement were combined.

The combination was carried out by a least squares estimator S, construed as the weighted sum on each spectrum doublet and each indentation. By representing the space of stiffness by the pair (E, v), the estimator S is $$S(E, v) = \sum_i \left( \frac{v_l(E, v) - v_{l,i}}{\sigma_{v_{l,i}}} \right)^2 + \quad (5)$$

-continued $$\sum_j \left(\frac{v(E,v) - v_{R,j}}{\sigma_{v_{R,j}}}\right)^2 + \sum_k \left(\frac{E_{red}(E,v) - E_{red,k}}{\sigma_{E_{red,k}}}\right)^2,$$

where $v_{I,i}$ is the $i^{th}$ value of $v_I$, of uncertainty $\sigma_{v_{I,i}}$, and similar notations are used for $v_{R,j}$ and $E_{red,k}$. As indicated in the equation (5), each single value was assigned a weight. Weights were determined by the uncertainty $\sigma_v$ of each single measurement. The confidence regions for the estimated parameters (E, v) are identified by the iso-valued level curves of the normalized estimator $$S'(E, v) = \frac{S(E, v) - S_{min}}{S_{min}} \quad (6)$$

S'(E,v) was calculated at the nodes of a discrete lattice, which was refined until the discretization effects became negligible. The confidence levels were considered at 68%, 90%, 95%, and 99%; for each of them, and for the number of available measurements (Brillouin doublets and indentation data), the theory of the estimation identifies the value of S'(E,v) that defines a confidence region.

The final results were obtained based on the confidence regions. The best estimates for E and v were assumed as the average point between the lower and upper limits of the confidence region 95%; the semi-width of such a range was assumed as the estimated uncertainty. Estimations for different pairs of modules compared to the pair (E, v) were obtained in a similar manner. The values found with this criterion are set forth in Table 3.

TABLE 3

| Substrate | Steel |
|---|---|
| E | 193.8 ± 9.9 |
| v | 0.295 ± 0.025 |
| G = $C_{44}$ | 74.9 ± 4.9 |
| B | 160 ± 15 |
| $C_{11}$ | 259 ± 12 |

The elastic modulus and the Poisson coefficient are very near to those for steel. Such a result suggests that the mechanical compatibility between $Al_2O_3$ barrier layers synthetized by PLD and the materials for nuclear applications is significant.

3.6 Tribologic Behaviour

Hardness was long considered as that property mainly defining the tribologic behaviour. However, there is a strong evidence suggesting that the tensile elastic deformation or breaking resistance, which are correlated to the ratio of hardness and elastic modulus, are parameter that are more suitable to describe the tribologic behaviour compared to the hardness itself. A high H/E ratio is often a reliable indicator of a good wear resistance of a coating. In any case, it is suitable to point out that an extremely high hardness should not be obtained to the detriment of the correspondence of elastic properties between the coating and the substrate, since this would limit the practical applicability of the coating.

The H/E ratio of $Al_2O_3$ barrier layers synthetized by PLD ranges between 0.045 and 0.055. It is interesting to point out that such a result is very similar to the H/E ratios of super-hard nanocomposite coatings (H≥40 GPa), such as Ti—B—N or Ti—Al—B—N phase systems, for which the typical values ranges between 0.05 and 0.09. Furthermore, the difference between the elastic properties of the coating and the substrate is significantly low.

A coating tribologic behaviour can also be seen as its ability in accumulating or dissipating the plastic deformation energy by a permanent deformation. It is possible to quantify the wear resistance by using the nanoindentation data through a non-dimensional microhardness dissipation parameter (MDP) defined as:

$$MDP = 1 - \frac{W_e}{W_{tot}} = \frac{W_p}{W_{tot}}. \quad (7)$$

$W_e$ is the elastic deformation work during the indentation, $W_{tot}$ is the total work of indentation and $W_p$ is the plastic deformation work. Such amounts are derived by the numerical integration of the area below the experimental force-displacement curves and are set forth in Table 1. The MDP of the barrier layers is in the range of 0.61÷0.64. This means that the coatings can dissipate a large amount of mechanical energy by plastic deformation without breaking or delaminating. Such a behaviour is extremely difficult to be obtained in ceramic materials.

The tribologic behaviour of the barrier layers was studied also by nanoscratch tests by using a conical diamond probe. All the samples had an apparent plastic behaviour and a strong interface bond; no significant damages were observed in scratch-resistance tests.

4. Discussion

Several authors found that the insertion of nanocrystalline ceramic particles in a relatively compliant amorphous matrix generates a high density of inter-phase interfaces promoting the deflection of fractures and the interruption of the growth thereof, thus increasing ductility and toughness. Furthermore, it was suggested that mechanisms such as interface diffusion and creep can explain the higher ductility and possibly superplasticity in mono-phase ceramic and multi-phase nanocrystalline structures. Such improvements are probably due to a delocalization of the shear stress, which would prevent the creep of grains, leaving the grain rotation in the amorphous matrix as the main deformation mechanism. By controlling the dimensions and the volume fraction of the nanocrystalline phase, the properties of the nanocomposite coatings can be adapted according to a wide range of configurations, mediating between hardness and elastic modulus to obtain a strict correspondence with the elastic modulus of the substrates.

The data set forth above show that $Al_2O_3$ grown by PLD has mechanical properties similar to those of metals, allowing to quantify it as a moderately rigid and ductile ceramic. TEM analysis revealed that the structure of the $Al_2O_3$ barrier layers synthetized by PLD is exactly of the type described above. Therefore, it is probable that the observed favorable mechanical properties depend on similar physical mechanisms. It is interesting to point out that the dimensions of the nanocrystalline domains (≈3-5 nm) seem to be larger than the distance between different clusters. This type of nanostructure would further increase the toughness of the coatings. Low-angle XRD showed that nanodomains are corundum crystallites. Since for the formation of such a crystalline structure a high temperature is required, it is probable that the crystallites had formed during the first moments of the ablative process, when local temperatures can exceed some thousands degrees. Therefore, the nanocomposite structure is self-assembled.

In any case, the causes underlying the properties observed in the $Al_2O_3$ barrier layers, i.e., the strong interface bond, the advanced mechanical properties, and the peculiar nanostructure thereof, are still not fully understood. Many process parameters, such as laser fluence or the background gas type, affects single and/or combined effects of various mechanisms, such as the interaction between the ablated particles and the background gas, the diffusion phenomena on the substrate surface, as well as the kinetic energy of the ablates species. Furthermore, it is considered that also the substrate temperature plays an important role in the diffusion phenomena and in the determination of the dimensions of the nanocrystalline grains; fine grains are produced at low temperatures, while higher temperatures promote the growth of large grains. Actually, preliminary experiments highlighted that for temperatures of the substrates of about 600° C., the mechanical properties of the coatings are nearer to those of sintered alumina. More precisely, the plastic resources decrease, while a significant increase of the hardness and stiffness is observed. Therefore, in such conditions, the difference between the coating properties and those of the substrate material is larger. In spite of this, H/E ratio is larger, thus probably indicating that the tribologic performance remains satisfactory.

Experiment 2

1. Coating Preparation

Steel substrates were prepared by cutting $10 \times 20 \times 1$ mm$^3$ plates of a ferritic-martensitic alloy of the Cr9Mo1 type. The samples were then polished using SiC-based abrasive papers with increasingly finer grain, then chamfered, cleaned with an ultrasonic device in acetone and isopropanol, and rinsed in isopropanol. The in situ cleaning procedures indicated with reference to the experiment 1 were then carried out.

$Al_2O_3$ barrier layers were synthetized by PLD in a stainless steel vacuum chamber at a low oxygen pressure, on only one face of the steel samples. All the process parameter were selected as indicated in the experiment 1 in order to obtain dense and compact layers with very smooth surfaces. A pure (99.99%) polycrystalline alumina target was mounted on a motorized support and hit, with an angle of 40°, by UV pulses (248 nm) produced by a Lumonics KrF laser at 20 Hz. The deposition process was optimized to improve the film morphology by minimizing splashing. The pulse energy was set at 250 mJ, while the focus was adjusted so as to have a fluence of 2.38 J/cm$^2$. Target-substrate distance and background oxygen pressure were set at 50 mm and 0.1 Pa, respectively. The thickness of the coatings was in the range of 5-8 µm, according to the number of laser pulses, with a deposition rate of about 1 nm/s.

2. Corrosion Test Equipment and Procedure

The corrosion tests were carried out in a tubular oven during 500 hours in an extra-pure $N_2$ atmosphere (<1 ppmv$_{H2O}$ and <0.5 ppmv$_{O2}$). The temperature was set at 620° C., with a certain degree of uncertainty due to the unevenness of the temperature profile along the oven tube length. The coated samples were maintained in 10-ml sintered alumina crucibles by steel supports. The crucibles were filled with lead grains, cut from a pure (99.99%) lead plate. The amount of molten lead in each crucible was about 5 ml.

3. Characterization

After 500 hours, the molten lead was directly poured from the crucibles, and the samples were left to cool in air. PbO was observed on the molten lead surface before pouring operation, this indicating that the molten material was probably saturated with oxygen during the test. The molten material adhered to the uncoated faces was let to solidify. Several cross-sections and longitudinal sections were cut by using a SiC rotating blade. The samples were then prepared by following standard procedures for the scanning electron microscope analysis.

The surface morphology and cross-sections of the samples were studied by means of a field emission (FE) SEM Zeiss Supra 40 microscope, provided with a spectrometer EDX (Oxford Instruments INCA). The potential difference of the electrons was set at 2 kV for imaging and at 10 kV for elemental analysis.

4. Results

The main object was to verify with the available means that the PLD coating technology is capable of providing a protection for steels in an HLM environment.

The SEM analysis of the samples before the exposure to the heavy liquid metal showed that the coating surface was smooth, with a very low droplet density.

After the exposure to the HLM environment, the uncoated face of the samples was visibly corroded, while the coated face was not wetted by the liquid metal. Furthermore, the structural integrity of the coating was kept after the treatment at 600° C. The SEM analysis showed that the specific conditions of the molten material lead to the formation of a double oxide layer on the uncoated surfaces, as it could be expected for the temperature range and the exposure period at issue. EDX scanning confirmed that the oxide structure consists in an outer layer of magnetite and an inner Fe—Cr spinel.

Instead, all the coated surfaces resulted to be protected against corrosion, as confirmed by the EDX maps. No dependance on the coating thickness was observed.

What is claimed is:

1. A nuclear fuel cladding tube for a liquid-metal or molten-salt cooled reactor, said cladding tube comprising a tubular body of metal material and a protective coating applied on an outer surface of the tubular body, to contact the coolant;

wherein said protective coating includes a plurality of alternating layers of a first coating material and a second coating material, wherein the first coating material is selected from the group consisting of ceramic materials and refractory metals, and wherein the second coating material is a metal, each layer of the first coating material comprising a matrix of the first coating material in amorphous phase and nanodomains of the first coating material in crystalline phase dispersed within the amorphous phase, wherein the amorphous phase and the crystalline phase are included in the first coating material with a first amount fraction and a second amount fraction, respectively; the first amount fraction being greater than the second amount fraction;

wherein the protective coating has a composition with a gradient extending from pure second coating material at an interface between the tubular body and the protective coating to pure first coating material at an outer surface of the coating.

2. The tube according to claim 1, wherein said first coating material is a ceramic material selected from the group consisting of oxides, carbides, and nitrides of aluminium, zirconium, silicon, tungsten, tantalum, titanium, chromium, and molybdenum and combinations thereof.

3. The tube according to claim 1, wherein said metal material of the tubular body is selected from the group consisting of ferritic-martensitic steels, austenitic steels, and oxide dispersion strengthened steels.

4. The tube of claim 1, wherein the first coating material comprises $Al_2O_3$.

5. The tube of claim 1, wherein the protective coating has a thickness of 0.5 µm to 8 µm.

6. The tube of claim 1, wherein the protective coating is able to withstand temperatures of up to 600° C.

7. The tube of claim 1, wherein the protective coating is able to prevent corrosion of the tubular body at temperatures of up to 800° C.

8. The tube of claim 1, wherein the nanodomains have a diameter and a distance from one nanodomain to another nanodomain, and wherein the diameter is greater than the distance.

9. The tube of claim 8, wherein the diameter is about 3 to about 5 nm.

\* \* \* \* \*